(12) United States Patent
Chang et al.

(10) Patent No.: US 7,626,528 B2
(45) Date of Patent: Dec. 1, 2009

(54) DIGITAL TO ANALOG CONVERTER WITH HIGH DRIVING CAPABILITY

(75) Inventors: Tsung-Hau Chang, Tai-Nan (TW); Kuang-Feng Sung, Taichung County (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 22 days.

(21) Appl. No.: 11/776,548

(22) Filed: Jul. 11, 2007

(65) Prior Publication Data

US 2008/0252503 A1 Oct. 16, 2008

(30) Foreign Application Priority Data

Apr. 14, 2007 (TW) ............................. 96113238 A

(51) Int. Cl.
*H03M 1/66* (2006.01)

(52) U.S. Cl. ....................................... 341/144; 341/145

(58) Field of Classification Search ................. 341/144, 341/143, 155, 172, 145
See application file for complete search history.

(56) References Cited

U.S. PATENT DOCUMENTS 7,388,532 B2 * 6/2008 Yen ............................. 341/144
2007/0132617 A1 * 6/2007 Le ............................... 341/120

* cited by examiner

*Primary Examiner*—Rexford N Barnie
*Assistant Examiner*—Joseph Lauture
(74) *Attorney, Agent, or Firm*—Winston Hsu

(57) ABSTRACT

A digital-to-analog converter with high driving capability includes a voltage generator for generating voltages, a voltage division circuit coupled to the voltage generator for outputting a plurality of reference voltages according to voltages generated by the voltage generator, a decode unit for decoding a digital signal, a switch circuit coupled to the voltage division circuit and the decode unit for switching to output one of the plurality of reference voltages, and a current generator coupled to the voltage division circuit for generating currents to the voltage division circuit.

11 Claims, 6 Drawing Sheets

US 7,626,528 B2

DIGITAL TO ANALOG CONVERTER WITH HIGH DRIVING CAPABILITY

BACKGROUND OF THE INVENTION

1. Field of the Invention

The present invention relates to a digital-to-analog converter with high driving capability, and more particularly, to a resistor string digital-to-analog converter utilizing current source circuits for providing driving currents to improve response speed and reduce effects of parasitic resistors.

2. Description of the Prior Art

A digital-to-analog converter is a common circuit element in various electronic devices, and can generate an analog output voltage for application to back-end circuits according to a digital input value. Many techniques are available for realizing the digital-to-analog converter, among which a resistor string (R-string) digital-to-analog converter is a direct realization method that has a simple circuit structure as well.

Please refer to FIG. 1. FIG. 1 is a schematic diagram of a prior art R-string digital-to-analog converter 10. The digital-to-analog converter 10 includes a voltage generator 11, a voltage division circuit 12, a decoding unit 13, and a switch circuit 14. The voltage generator 11 includes a first voltage source 110 and a second voltage source 115, which are respectively utilized for generating a first voltage V1 and a second voltage V2. The voltage division circuit 12 includes a first terminal 120, a second terminal 125, resistors R1-Rn, and output terminals OP1-OPn. The first terminal 120 and the second terminal 125 are respectively coupled to the first voltage source 110 and the second voltage source 115; the resistors R1-Rn are coupled in series, and are coupled between the first terminal 120 and the second terminal 125; and the output terminals OP1-OPn, respectively coupled between adjacent resistors of the resistors R1-Rn, are utilized for outputting reference voltages Vref1-Vrefn. Thus, the voltage division circuit 12 performs voltage division by the resistors R1-Rn to generate and output the reference voltages Vref1-Vrefn to the output terminals OP1-OPn according to the first voltage V1 and the second voltage V2. The decoding unit 13 is utilized for receiving a digital input value and generating a control signal Ctr, accordingly. The switch circuit 14 is coupled to the voltage division circuit 12 and the decoding unit 13, and is utilized for switching to output one of the reference voltages Vref1-Vrefn according to the control signal Ctr outputted by the decoding unit 13. In order to meet requirements for ideal voltage sources, the first voltage source 110 and the second voltage source 115 can be realized by negative-feedback operational amplifier circuits, as shown in FIG. 2 and FIG. 3, respectively.

Therefore, using the resistor string of the voltage division circuit 12, the prior art digital-to-analog converter 10 can perform voltage division to generate the demanded reference voltages Vref1-Vrefn. And, by utilizing the decoding unit 13 for decoding to output the control signal Ctr according to the input digital signal, the switch circuit 14 can then switch to output an analog voltage corresponding to the input digital signal correctly.

The R-string digital-to-analog converter is most often used today to generate a single analog output voltage, and thus output loads of each voltage division node of the resistor string (i.e. the output terminals OP1-OPn) are very low. However, for applications in some specific fields, such as in a source driver of a liquid crystal display, multiple analog voltages often need to be outputted at the same time. Thus, more than one of the switch circuits 14 need to be coupled to the voltage division circuit 13, with a result that the output loads of the voltage division circuit 13 are increased greatly. In general, as the output voltage of the digital-to-analog converter 10 varies, the first voltage source 110 and the second voltage source 115 also vary to output the corresponding driving currents according to variation of the output loads. However, some response time is needed when the operational amplifiers of the first voltage source 110 and the second voltage source 115 react. Especially in applications with larger output loads, the range of the driving currents is too large, so that the voltage source circuits realized by the negative-feedback operational amplifier circuits may have poor response speed.

In addition, when laying out the R-string digital-to-analog converter, there exist parasitic resistors PR1 and PR2 respectively between the voltage sources 110 and 115 and the voltage division circuit 12, as shown in FIG. 1. In this case, part of the voltages generated by the voltage sources 110 and 115 may be lost in the parasitic resistors PR1 and PR2, and thus errors in the reference voltages Vref1-Vrefn outputted by the voltage division circuit 12 occur, which further influences accuracy of the outputted analog voltages.

SUMMARY OF THE INVENTION

It is therefore a primary objective of the present invention to provide a digital-to-analog converter with high driving capability.

The present invention discloses a digital-to-analog converter with high driving capability. The digital-to-analog converter includes a voltage generator for generating voltages; a voltage division circuit, coupled to the voltage generator, for outputting a plurality of reference voltages according to the voltages generated by the voltage generator; a decoding unit for decoding a digital signal; a switch circuit, coupled to the voltage division circuit and the decoding unit, for switching to output one of the plurality of reference voltages; and a current generator, coupled to the voltage division circuit, for providing currents to the voltage division circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
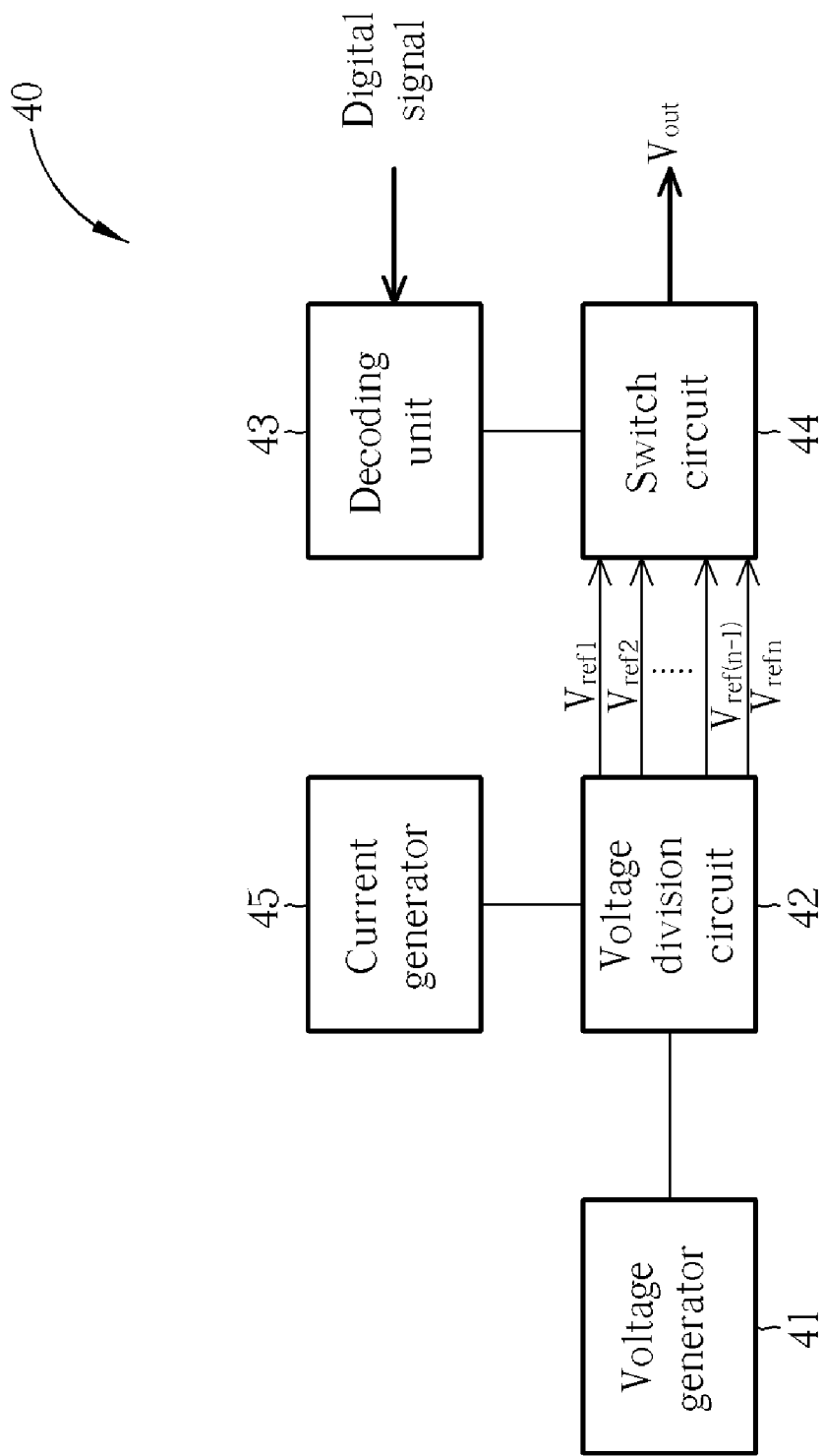
FIG. 4 is a schematic diagram of a digital-to-analog converter with high driving capability according to the present invention.

Please refer to FIG. 4. FIG. 4 is a schematic diagram of a digital-to-analog converter 40 with high driving capability according to the present invention. The digital-to-analog converter 40 includes a voltage generator 41, a voltage division circuit 42, a decoding unit 43, a switch circuit 44, and a current generator 45. The voltage division circuit 42 is coupled to the voltage generator 41, and is utilized for outputting reference voltages Vref1-Vrefn according to voltages generated by the voltage generator 41. The decoding unit 43 is utilized for decoding a digital signal and outputting a corresponding decoding result to the switch circuit 44. The switch circuit 44 is coupled to the voltage division circuit 42 and the decoding unit 43, and is utilized for switching to output one of the reference voltages Vref1-Vrefn according to the decoding result of the decoding unit 43. The current generator 45 is coupled to the voltage division circuit 42, and is utilized for generating driving currents to the voltage division circuit 42.

Therefore, in the digital-to-analog converter 40, the voltage division circuit 42 outputs the reference voltages Vref1-Vrefn according to the voltages generated by the voltage generator 41, and the decoding unit 43 outputs the decoding result according to the input digital signal, so that the switch circuit 44 can switch to output an analog reference voltage corresponding to the input digital signal correctly. Furthermore, by utilizing the current generator 45 for providing driving currents to the voltage division circuit 42, the present invention can enhance the driving capability of the digital-to-analog converter 40 to reduce demands on the driving capability of the voltage generator 41, so as to improve the poor response speed problem in the prior art.

Figure 1:
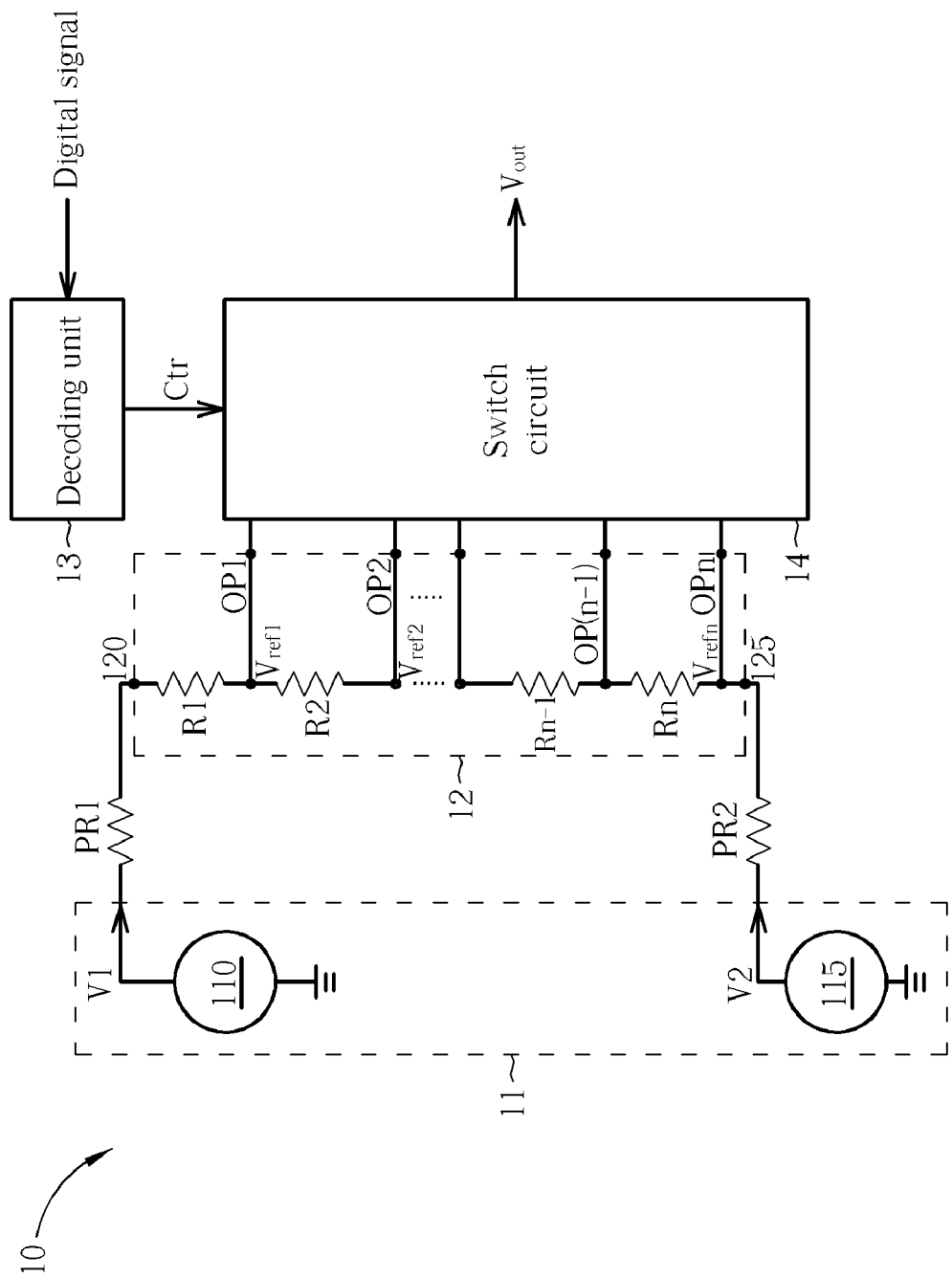
FIG. 1 is a schematic diagram of a prior art R-string digital-to-analog converter.
Figure 2:
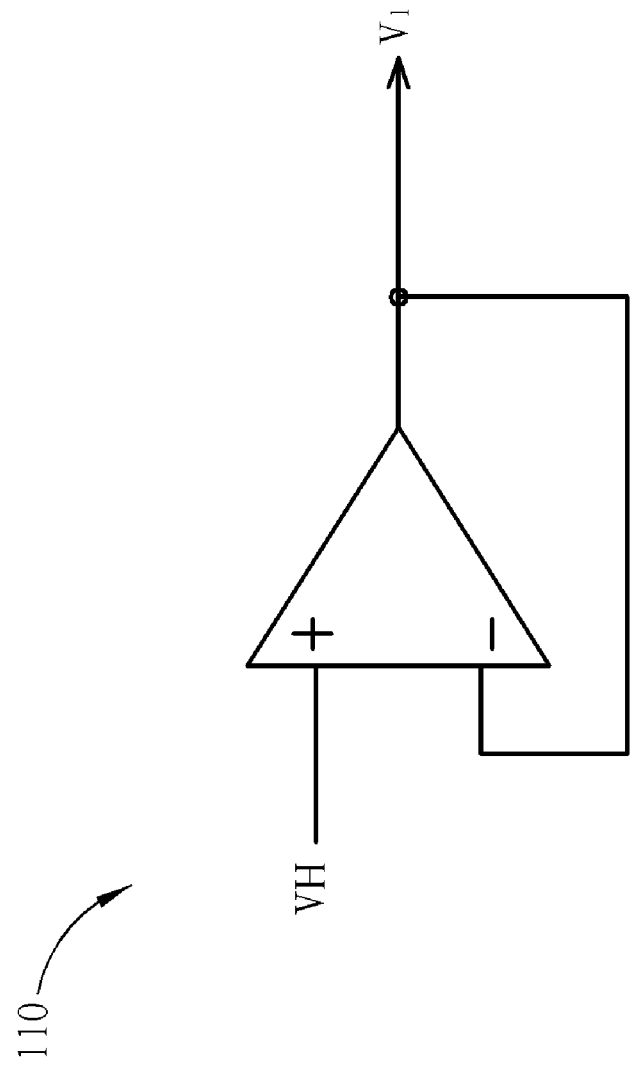
FIG. 2 is a schematic diagram of a first voltage source in FIG. 1.
Figure 3:
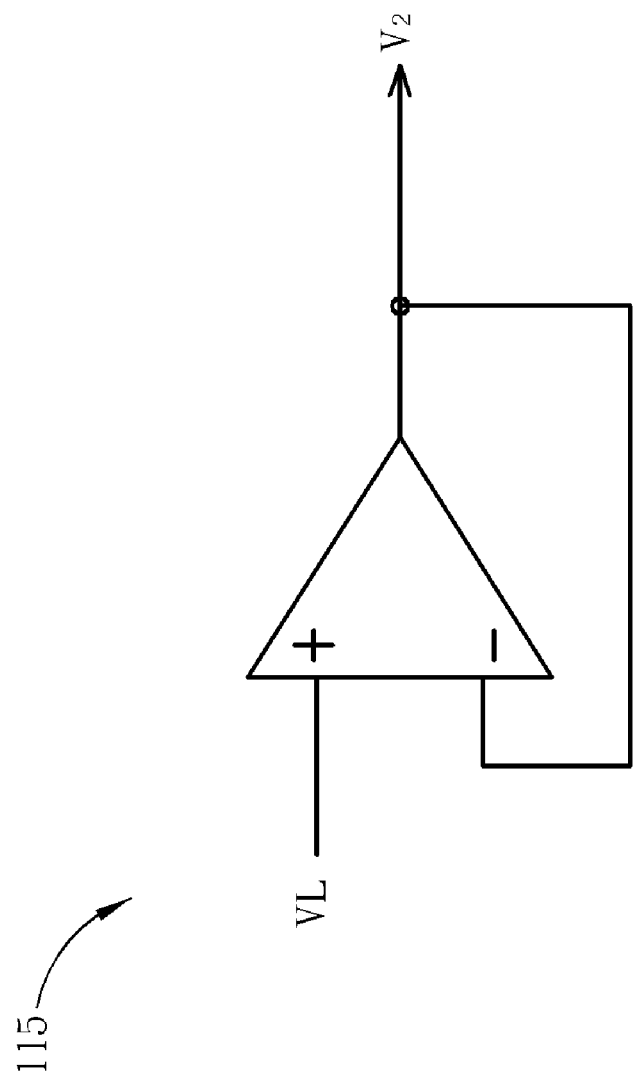
FIG. 3 is a schematic diagram of a second voltage source in FIG. 1.
Figure 5:
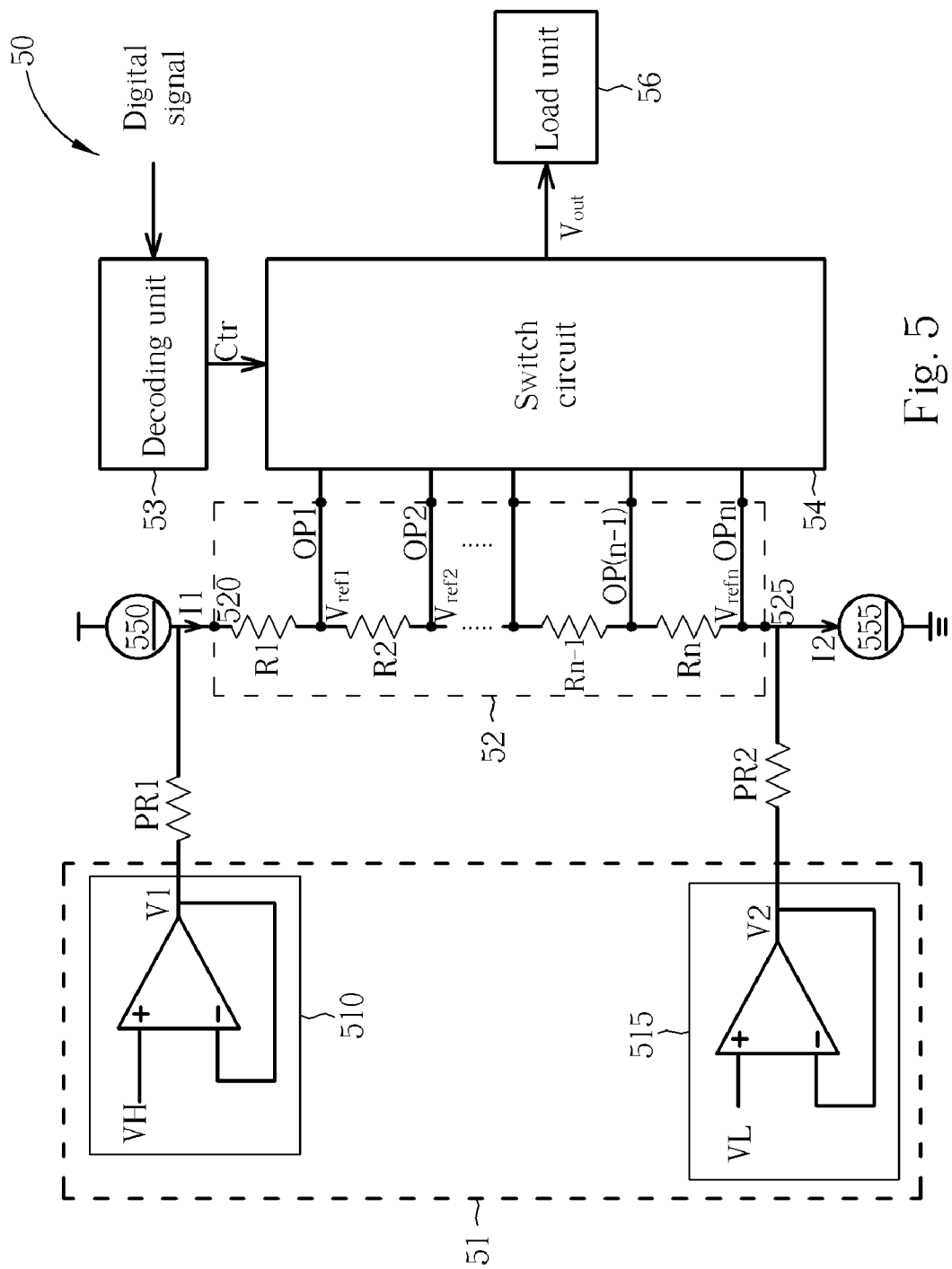
FIG. 5 is a schematic diagram of a digital-to-analog converter with high driving capability according to an embodiment of the present invention.
Figure 6:
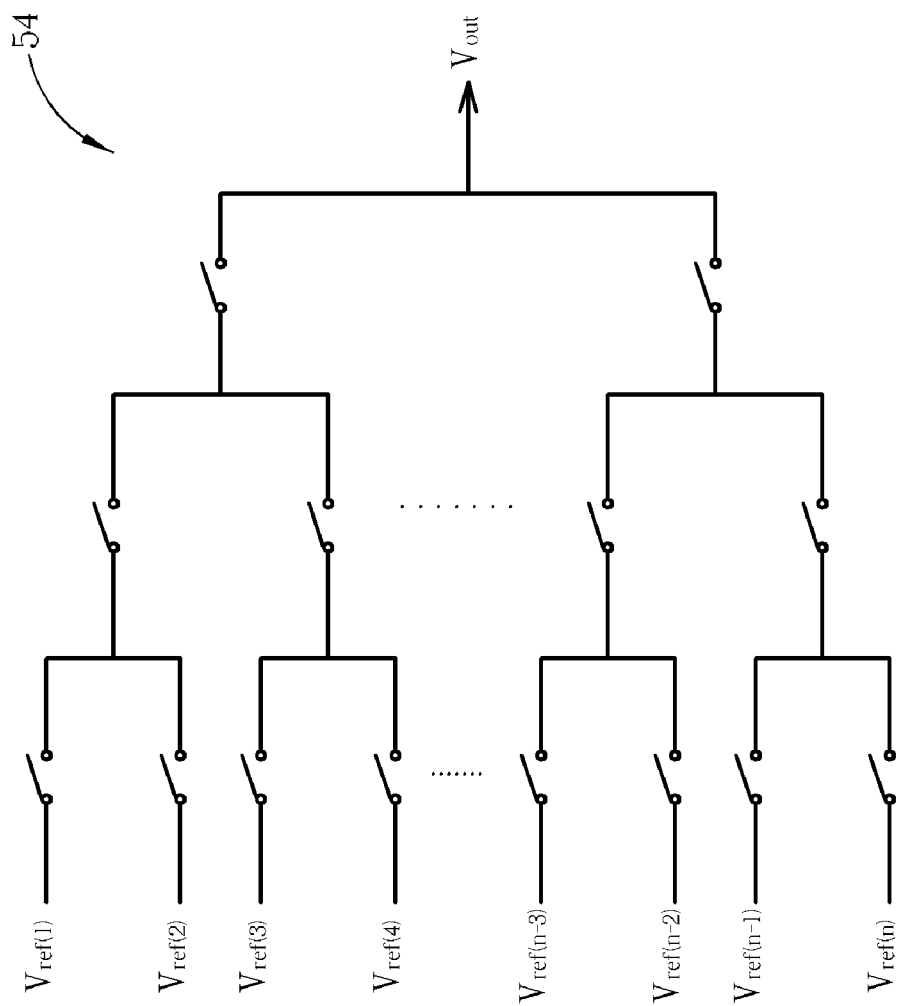
FIG. 6 is a schematic diagram of an embodiment of the switch circuit in FIG. 5.

Please refer to FIG. 5. FIG. 5 is a schematic diagram of a digital-to-analog converter 50 with high driving capability according to an embodiment of the present invention. The digital-to-analog converter 50 is utilized for realizing the digital-to-analog converter 40 in FIG. 4, and includes a voltage generator 51, a voltage division circuit 52, a decoding unit 53, a switch circuit 54, a current generator 55, and a load unit 56. The voltage generator 51 includes a first voltage source 510 and a second voltage source 515, which are respectively utilized for generating a first voltage V1 and a second voltage V2. The voltage division circuit 52 includes a first terminal 520, a second terminal 525, resistors R1-Rn, and output terminals OP1-OPn. The operation of the voltage generator 51, the voltage division circuit 52, the decoding unit 53, and the switch circuit 54 is similar to that of the voltage generator 11, the voltage division circuit 12, the decoding unit 13, and the switch circuit 14 in FIG. 1, and thus is not described again. In addition, the switch circuit 54 can be realized as shown in FIG. 6, but is not limited thereto. The current generator 55 includes a first current source 550 and a second current source 555. The first current source 550 is coupled to the first terminal 520 of the voltage division circuit 52, and is utilized for providing a first driving current I1 to the voltage division circuit 52. The second current source 555 is coupled to the second terminal 525 of the voltage division circuit 52, and is utilized for draining a second driving current I2 from the voltage division circuit 52. Further, the load unit 56 is coupled to the switch circuit 54, and is utilized for receiving the analog reference voltage outputted by the switch circuit 54.

Compared with the prior art, which utilizes voltage source circuits for providing driving currents, when the output voltage of the digital-to-analog converter 50 varies, the first current source 550 and the second current source 555 can immediately provide the driving currents I1 and I2 to the voltage division circuit 52 according to variation of the output load of the voltage division circuit 52, and thus the digital-to-analog converter 50 does not take the time required to wait for the response of the voltage sources 510 and 515. Therefore, the response speed of the digital-to-analog converter 50 can be enhanced significantly. Moreover, since the voltage sources 510 and 515 need not provide the driving currents, the layout size of the digital-to-analog converter 50 can also be reduced, such that production cost can be saved as well. In other words, the voltage sources 510 and 515 only need to provide the stable voltages V1 and V2, instead of having a high driving capability. In addition, since the driving currents are mostly provided by the current sources 550 and 555, the currents passing through the parasitic resistors PR1 and PR2 can be reduced greatly, and thus the voltages lost in the parasitic resistors can be reduced as well. In this case, the present invention can significantly reduce the effect of the parasitic resistors, and thus the reference voltages Vref1-Vrefn outputted by the voltage division circuit 52 become more precise, so as to further enhance accuracy of the output analog voltage. Please note that the digital-to-analog converter 50 is merely an exemplary embodiment of the present invention, and appropriate modifications made by those skilled in the art according to practical demands are still in the range of the present invention.

As mentioned above, the digital-to-analog converter of the present invention utilizes the current source circuits for providing the driving currents to improve the poor response speed problem of the prior art, and reduce the demand for high driving capability on the voltage source circuits. In addition, the present invention can reduce the currents passing through the parasitic resistors, and thus the effect of the parasitic resistors can be reduced, so as to enhance the accuracy of the output analog voltage significantly.

Those skilled in the art will readily observe that numerous modifications and alterations of the device and method may be made while retaining the teachings of the invention.

What is claimed is:

1. A digital-to-analog converter with high driving capability comprising:
    a voltage generator for generating voltages;
    a voltage division circuit, coupled to the voltage generator, for outputting a plurality of reference voltages according to the voltages generated by the voltage generator;
    a decoding unit for decoding a digital signal;
    a switch circuit, coupled to the voltage division circuit and the decoding unit, for switching to output one of the plurality of reference voltages; and
    a current generator, only coupled to the voltage division circuit, for providing currents to the voltage division circuit to enhance the driving capability of the digital-to-analog converter such that current and voltage passing across a parasitic resistance of the circuit can be reduce to further enhance the accuracy of the digital-analog converter.

2. The digital-to-analog converter of claim 1, wherein the voltage division circuit comprises:
    a first terminal;
    a second terminal;
    a plurality of resistors, coupled in series between the first terminal and the second terminal; and
    a plurality of output terminals, each of the plurality of output terminals coupled between adjacent resistors of the plurality of resistors for outputting a reference voltage to the switch circuit.

3. The digital-to-analog converter of claim 2, wherein the voltage generator comprises:
    a first voltage source, coupled to the first terminal of the voltage division circuit, for generating a first voltage; and
    a second voltage source, coupled to the second terminal of the voltage division circuit, for generating a second voltage.

4. The digital-to-analog converter of claim 3, wherein the first voltage source comprises a voltage buffer circuit.

5. The digital-to-analog converter of claim 4, wherein the voltage buffer circuit is a negative-feedback operational amplifier circuit.

6. The digital-to-analog converter of claim 3, wherein the second voltage source comprises a voltage buffer circuit.

7. The digital-to-analog converter of claim 6, wherein the voltage buffer circuit is a negative-feedback operational amplifier circuit.

8. The digital-to-analog converter of claim 2, wherein the current generator comprises:
    a first current source, coupled to the first terminal of the voltage division circuit, for providing a first driving current to the first terminal; and
    a second current source, coupled to the second terminal of the voltage division circuit, for draining a second driving current from the second terminal.

9. The digital-to-analog converter of claim 1, wherein the switch circuit is further coupled to a load unit for receiving a voltage outputted by the switch circuit.

10. The digital-to-analog converter of claim 1 further comprising a voltage buffer circuit, coupled to the switch circuit, for buffering a voltage outputted by the switch circuit.

11. The digital-to-analog converter of claim 10, wherein the voltage buffer circuit is a negative-feedback operational amplifier circuit.

* * * * *